(12) United States Patent
Van Der Voort et al.

(10) Patent No.: US 6,597,230 B2
(45) Date of Patent: Jul. 22, 2003

(54) ELECTRONIC DEVICE

(75) Inventors: Ronald Hans Van Der Voort, Eindhoven (NL); Machiel Antonius Martinus Hendrix, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 119 days.

(21) Appl. No.: 10/144,824

(22) Filed: Oct. 25, 2001

(65) Prior Publication Data

US 2002/0196011 A1 Dec. 26, 2002

(30) Foreign Application Priority Data

Oct. 26, 2000 (EP) ............................................. 00203714

(51) Int. Cl.$^7$ ................................................. G06G 7/24
(52) U.S. Cl. ....................... 327/334; 327/560
(58) Field of Search ....................... 327/334, 350–354, 327/346, 347, 348, 349, 560–563, 178, 179, 180

(56) References Cited

U.S. PATENT DOCUMENTS

| | | | | | |
|---|---|---|---|---|---|
| 3,553,428 | A | * | 1/1971 | McGhee | 219/494 |
| 4,112,264 | A | * | 9/1978 | Abramson et al. | 714/712 |
| 4,295,189 | A | * | 10/1981 | Boys | 363/41 |
| 4,318,010 | A | * | 3/1982 | Hurley et al. | 327/180 |
| 4,356,553 | A | * | 10/1982 | Steinle et al. | 702/60 |

* cited by examiner

Primary Examiner—Toan Tran

(57) ABSTRACT

A circuit for measuring the power supplied by a voltage source supplying a sine-shaped voltage by averaging the multiplication of the instantaneous value of the current supplied by the voltage source and a square-wave that is synchronized with the sine-shaped voltage, and by multiplying the result by the actual value of the voltage.

9 Claims, 2 Drawing Sheets

ELECTRONIC DEVICE

Figure 1:
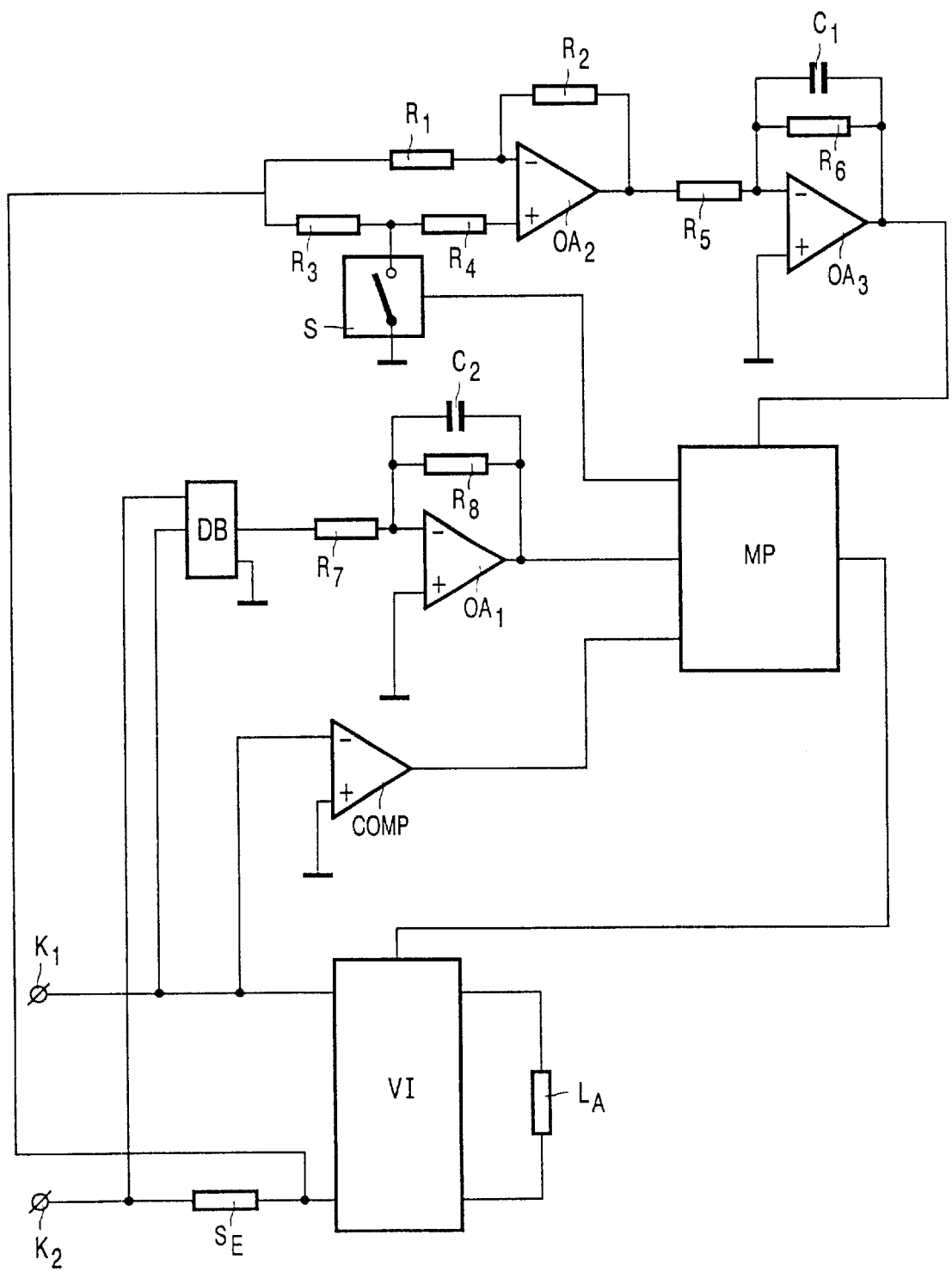

The invention relates to a electronic device for generating a power signal $P_{av}$, which is a measure of the average power taken from a voltage source VB supplying a sine-shaped voltage Vs.

Such a electronic device is well-known and frequently comprises a multiplier. The operation of such a multiplier is based on a multiplication algorithm. Known multiplication algorithms are, inter alia, the "triangle-averaging multiplying technique", the "time division multiplying technique", the "quarter-squares multiplying technique", the "variable transconductance multiplying technique" and an algorithm composed of, in succession, "sampling", "A/D-conversion" and "digital multiplication". These algorithms are described in, for example, "Greame J. G. and Tobey G. E., Operational Amplifier-Design and Application, McGraw-Hill, 1971, pp. 273–276" and "Rogers A. E., Analog Computation in Engineering Design, McGraw-Hill, 1960, pp. 22–28".

The application of any one of these well-known multiplication algorithms in a electronic device for generating a power signal has the following drawbacks: limited accuracy, temperature sensitivity, complexity of the electronics and hence a high cost price. With respect to the latter algorithm it applies, more particularly, that it is very inaccurate at a low "sampling rate", particularly in the case of a phase shift between the voltage and the current or if the shape of the current deviates substantially from a sine shape.

It is an object of the invention to provide a electronic device which is comparatively inexpensive to manufacture by virtue of its comparatively simple structure, and which enables a power signal to be generated which is a comparatively accurate measure of the power supplied by the voltage source VB.

To achieve this, a electronic device as mentioned in the opening paragraph comprises
a circuit part I for generating a signal U which is a measure of the effective value of the voltage Vs,
a circuit part II for generating a square-wave voltage Vb which is in phase with the sine-shaped voltage Vs,
a circuit part III for generating a signal which is a measure of the product Q of a current Is supplied by the voltage source VB and the square-wave voltage Vb,
a circuit part IV for generating a signal $Q_{av}$ which is a measure of the average value of the signal Q, and
a circuit part V for generating a signal which is a measure of the product of the signal $Q_{av}$ and the signal U, the signal generated by the circuit part V forming the power signal $P_{av}$.

It has been found that a electronic device in accordance with the invention can be embodied so as to be comparatively simple. It has also been found that a electronic device in accordance with the invention enables a power signal to be generated, which is a very accurate measure of the power supplied by the voltage source VB, said power signal additionally being highly temperature-independent.

If the current Is supplied by the voltage source VB is sine-shaped and in phase with the voltage Vs, and if the square-wave voltage VB is equal to zero only at instants at which also the sine-shaped voltage Vs is equal to zero, then the power signal $P_{av}$ is directly proportional to the power supplied by the voltage source. However, frequently the current Is taken from the voltage source Vb is not sine-shaped but can be described, using Fourier analysis, as the sum of an infinite number of sine-shaped terms, the first term having a frequency equal to the frequency of the sine-shaped voltage Vs, and the other terms having a frequency that is a multiple of the frequency of the sine-shaped voltage Vs. Correspondingly, the square-wave voltage Vb can be described, using said Fourier analysis, as the sum of an infinite number of sine-shaped terms. Due to the symmetry of the square-wave voltage, however, this sum only comprises terms whose frequency is an odd number of times the frequency of the sine-shaped voltage Vs. From this it can be derived that the product P of the current Is and the square-wave voltage Vb can be expressed as the sum of an infinite number of terms, each term being a product of two sine functions. Only if both sine functions in such a product have the same frequency, the relevant term of the product P has a finite average value. It can thus be mathematically derived that, in the case of such a non-sine shaped current Is and a square-wave voltage Vb which is equal to zero only if the sine-shaped voltage Vs is also equal to zero, the power signal $P_{av}$ can be expressed as the sum of an infinite number of terms, each term of the square-wave voltage Vb yielding a term of the power signal $P_{av}$. The first term of the power signal $P_{av}$ represents the power supplied by the voltage source VB. Dependent upon the shape of the current supplied by the voltage source VB, the second term and the higher terms of $P_{av}$ will make a comparatively large, or less large, contribution to the value of $P_{av}$. In other words, the value of $P_{av}$ deviates more from the first term of $P_{av}$, which represents the power supplied by the voltage source VB, as the shape of the current Is deviates more from a sine shape. It has been found, however, that in many applications the power signal $P_{av}$ generated in the manner described hereinabove is a sufficiently accurate measure of the power supplied. If, however, the second term and the higher terms of the power signal $P_{av}$ lead to an insufficiently accurate representation of the power supplied, then the second and, if desirable, also a random number of the higher terms of $P_{av}$ can be zeroed. This is brought about by changing the shape of the square-wave voltage Vb in such a manner that it is equal to zero not only at the instants at which the voltage Vs is equal to zero but also at other instants. To achieve this, the square-wave voltage Vb becomes equal to zero N+1 times during each half period, where N is an even number, and the phase angles $\alpha_m$ corresponding to the instants at which the square-wave voltage Vb is zero are represented by the formulas $$\alpha_m = \pi - \alpha_{N-m+1} \text{ and } (4/n \cdot \pi) \cdot \left(1 + \sum_{m=1}^{N/2} (-1)^m \cos n \cdot \alpha_m\right) = 0,$$

wherein m is a natural number and n is an odd number larger than or equal to 3. The expression to the left of the = sign in the second formula is the amplitude of a term of the square-wave voltage Vb. As indicated hereinabove, this square-wave voltage only comprises terms whose frequency is an odd number of times the frequency of the voltage Vs. For this reason, for n=3, the expression to the left of the = sign in the second formula is equal to the amplitude of the second term of the square-wave voltage Vb. For n=5, this expression is equal to the amplitude of the third term, etc. If n=3 in said formulas, then the phase angles become $\alpha_1=20°$ and $\alpha_2=160°$. In other words, if the shape of the square-wave voltage Vb is chosen to be such that, in each half period, said square-wave voltage becomes equal to zero not only for the phase angles 0° and 180° but also for the phase angles 20° and 160°, it is achieved that the second term in the sum of terms, which describes the square-wave voltage Vb, is equal to zero. As a result, the second term of the power signal $P_{av}$ is also equal to zero. As a result, the difference between the first term of $P_{av}$, which represents the power supplied by the voltage source VB, and the (total) value of the power signal $P_{av}$ is smaller than it would be if the square-wave voltage Vb is equal to zero only at the instants at which Vs is equal to zero. Correspondingly, the number of zero-axis crossings of the square-wave voltage Vb can be further increased by introducing zero-axis crossings for the phase angles that are obtained when n=5 in the above-mentioned formulas. In the sum of terms describing the square-wave voltage Vb, the second and the third term are equal to zero now. As a result, the second and the third term of the power signal $P_{av}$ are also equal to zero. Consequently, the difference between the first term of $P_{av}$, which represents the power supplied by the voltage source VB, and the value of the power signal $P_{av}$ has decreased further. In other words, the difference between the first term of the power signal $P_{av}$, which represents the actual power supplied by the voltage source VB, and the (total) value of the power signal $P_{av}$ can be reduced to any value by increasing the number of zero-axis crossings of the square-wave voltage Vb. In practice it has been found that elimination of the second term or, at the most, the second and the third term from the sum describing the square-wave voltage Vb leads, in the majority of the practical applications, to a sufficiently small difference between the first term of the power signal $P_{av}$ and the total value of the power signal $P_{av}$.

Satisfactory results were obtained with embodiments of a electronic device in accordance with the invention, wherein the circuit part I comprises a rectifier and a low-pass filter, and with embodiments wherein the circuit part IV comprises a low-pass filter.

In a particularly simple and hence inexpensive embodiment of a electronic device in accordance with the invention, the circuit part II and the circuit part III comprise
a switching element, and
a control circuit coupled to a control electrode of the switching element for rendering the switching element conducting and non-conducting if the phase angle $\alpha_m$ has a value at which the square-wave voltage Vb is zero.

Such a control circuit can be obtained, for example, by means of a microprocessor wherein the values of the phase angle $\alpha_m$ at which the switching element must be rendered conducting or non-conducting are fixed in a memory forming part of the microprocessor.

A electronic device in accordance with the invention can very suitably form part of a power supply circuit provided with a circuit part VI for generating a current from the sine-shaped voltage Vs, which current can be used to energize a load. This load may be, for example, a lamp.

These and other aspects of the invention will be apparent from and elucidated with reference to the embodiment(s) described hereinafter.

Figure 2:
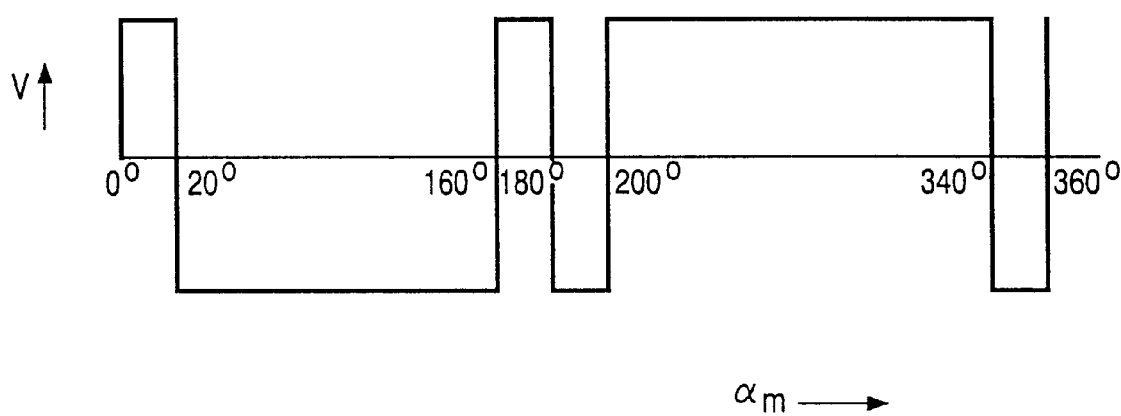

In the drawing:

FIG. 1 shows a power supply circuit provided with an embodiment of a electronic device in accordance with the invention and with a circuit part for generating a current from a sine-shaped voltage Vs, which current can be used to energize a lamp, and FIG. 1 also shows a lamp connected to this power supply circuit, and FIG. 2 shows the shape of a square-wave voltage generated by a part of the power supply circuit shown in FIG. 1.

In FIG. 1, K1 and K2 are input terminals which are to be connected to a supply voltage source VB supplying a sine-shaped supply voltage. Input terminal K1 is connected to a first input of circuit part VI for generating a current from a sine-shaped voltage Vs supplied by the voltage source VB, which current can be used to energize a lamp. Input terminal K2 is formed, via a sensor SE, by an ohmic resistor connected to a second input of circuit part VI. A lamp La connects a first output of circuit part VI to a second output of circuit part VI. Input terminal K1 is also connected to a first input of comparator COMP and to a first input of rectifier DB which, in this example, is formed by a diode bridge. A second input of comparator COMP is connected to a ground terminal. An output of comparator COMP is connected to a first input of microprocessor MP. Input terminal K2 is connected to a second input of rectifier DB. A first output of rectifier DB is connected to a first input of operational amplifier OA1 via ohmic resistor R7. A second output of rectifier DB is connected to a ground terminal. A second input of operational amplifier OA1 is also connected to a ground terminal. The first input of operational amplifier OA1 is connected to an output of operational amplifier OA1 by means of an ohmic resistor R8. Ohmic resistor R8 is shunted by capacitor C2. Rectifier DB, operational amplifier OA1, ohmic resistors R7 and R8, and capacitor C2 jointly form a circuit part I for generating a signal U which is a measure of the effective value of the voltage Vs. Operational amplifier OA1, ohmic resistors R7 and R8 and capacitor C2 jointly form a low-pass filter. The output of operational amplifier OA1 is also connected to a second input of microprocessor MP. A series arrangement of ohmic resistors R1, R3 and R4 connects a first input of operational amplifier OA2 to a second input of operational amplifier OA2. A junction point of ohmic resistors R1 and R3 is connected to an end of the sensor SE. A junction point of ohmic resistors R3 and R4 is connected to a ground terminal by means of a switching element S. The first input of operational amplifier OA2 is connected to an output of operational amplifier OA2 by means of an ohmic resistor R2. In the example shown in FIG. 1, the resistance value of R1 is chosen to be equal to that of R2. The output of operational amplifier OA2 is connected to a first input of operational amplifier OA3 by means of an ohmic resistor R5. A second input of operational amplifier OA3 is connected to a ground terminal. The first input of operational amplifier OA3 is connected to an output of operational amplifier OA3 by means of an ohmic resistor R6. Ohmic resistor R6 is shunted by capacitor C1. The output of operational amplifier OA3 is connected to a third input of microprocessor MP. A first output of microprocessor MP is connected to a control electrode of the switching element S. Microprocessor MP, switching element S, operational amplifier OA2 and ohmic resistors R1, R2, R3 and R4, in this example, jointly form a circuit part II for generating a square-wave voltage and a circuit part III for generating a signal which is a measure of the product Q of a current Is supplied by the voltage source VB and the square-wave voltage. Ohmic resistors R5 and R6, capacitor C1 and operational amplifier OA3 jointly form a low-pass filter which, in this example, forms a circuit part IV for generating a signal $Q_{av}$ which is a measure of the average value of the signal Q. A second output of the microprocessor MP is connected to a third input of circuit part VI.

The operation of the example shown in FIG. 1 is as follows.

If the input terminals K1 and K2 are connected to a supply voltage source VB generating a sine-shaped voltage Vs, then the circuit part VI takes a current Is from the voltage source VB and generates a current through the lamp La. The signal at the output of comparator COMP changes from high to low, or conversely, at each zero-axis crossing of the sine-shaped voltage Vs. This signal is also present on the first input of microprocessor MP. On the second input of said microprocessor, a signal U is present which is generated by the circuit part I, and which is a measure of the effective value of the sine-shaped voltage Vs. On the junction point of ohmic resistors R1 and R3, a signal is present which is proportional to the instantaneous value of the current Is. This signal is multiplied by a square-wave voltage having the same frequency as the voltage Vs and being in phase with the signal on the first input of the microprocessor and hence also with Vs. This multiplication can be attributed to the fact that the microprocessor renders the switching element S conducting or non-conducting at predetermined instants in each period of the square-wave voltage. These predetermined instants are defined in a Table present in a memory forming part of the microprocessor. The square-wave voltage has a zero-axis crossing for each one of said predetermined instants. It is to be noted that in the case of a sine shape of the current Is, the signal at the output of comparator COMP can be used directly as a control signal for the switching element S. The signal Q, which is a measure of the instantaneous value of the product of the current Is and the square-wave voltage Vb, is present at the output of operational amplifier OA2. A signal $Q_{av}$ is generated from this signal Q by circuit part IV, said signal $Q_{av}$ being a measure of the average value of signal Q and being present at the output of operational amplifier OA3 and the third input of the microprocessor MP. The microprocessor generates a power signal $P_{av}$, which is a measure of the average power supplied by the voltage source VB, by multiplying the signal U and the signal $Q_{av}$. It is to be noted that the signal U and the signal $Q_{av}$ are DC signals which do not vary substantially with respect to time, so that the multiplication can be carried out using simple means, and a low "sampling rate" of the microprocessor is sufficient. The power signal $P_{av}$ consists of an infinite number of terms, the first of which represents the power supplied by the voltage source VB. By adapting the shape of the square-wave, it becomes possible to reduce the difference between the first term of the power signal $P_{av}$, which represents the power supplied by the voltage source VB, and the value of the signal $P_{av}$ to any desired value. This can be achieved by choosing the number of predetermined instants at which the square-wave voltage has a zero-axis crossing to coincide with instants in such a way that the following applies to the corresponding phase angles $\alpha_m$:

$$\alpha_m = \pi - \alpha_{N-m+1} \text{ and } (4/n \cdot \pi) \cdot \left(1 + \sum_{m=1}^{N/2} (-1)^m \cos n \cdot \alpha_m\right) = 0,$$

wherein m is a natural number and n is an odd number which is larger than or equal to 3, and N+1 is the number of zero-axis crossings of the square-wave voltage VB per half period.

The value of $P_{av}$ is compared by the microprocessor with a reference signal, which is a measure of a desired value of the power supplied, and the microprocessor generates a control signal which depends on the result of this comparison. This control signal is present at the second output of the microprocessor and the third input of the circuit part VI. Under the influence of the control signal, the operating state of the circuit part VI is continuously adapted such that the value of $P_{av}$ is substantially equal to the desired value of the power supplied.

In FIG. 2, a phase angle in degrees is plotted along the horizontal axis, and the voltage in arbitrary units is plotted along the vertical axis. FIG. 2 shows the shape of the square-wave voltage Vb for a value of N=2. By means of the above-mentioned formulas, it can be readily derived that this shape of the square-wave voltage Vb has zero-axis crossings at instants which correspond to the phase angles 0°, 20°, 160°, 180°, 200°, 340° and 360°. If this shape of the square-wave voltage is realized by rendering the switching element conducting or non-conducting at instants which correspond to these phase angles, it is achieved that the second term of the signal $P_{av}$ is equal to zero. As indicated hereinabove, a random number of terms of the signal $P_{av}$ can be reduced to zero by adapting the shape of the square-wave voltage Vb.

What is claimed is:

1. A electronic device for generating a power signal $P_{av}$, which is a measure of the average power taken, via poles of the voltage source VB, from a voltage source VB which supplies a sine-shaped voltage Vs, which electronic device is provided with a circuit part I for generating a signal U which is a measure of the effective value of the voltage Vs, a circuit part II for generating a square-wave voltage Vb which is in phase with the sine-shaped voltage Vs, a circuit part III for generating a signal which is a measure of the product Q of a current Is supplied by the voltage source VB and the square-wave voltage Vb, a circuit part IV for generating a signal $Q_{av}$ which is a measure of the average value of the signal Q, and a circuit part V for generating a signal which is a measure of the product of the signal $Q_{av}$ and the signal U, the signal generated by the circuit part V forming the power signal $P_{av}$.

2. A electronic device as claimed in claim 1, wherein the square-wave voltage Vb is equal to zero only at the instants at which the sine-shaped voltage Vs is equal to zero.

3. A electronic device as claimed in claim 1, wherein the square-wave voltage Vb becomes equal to zero N+1 times in each half period, where N is an even number, and the phase angles $\alpha_m$ for which the square-wave voltage Vb is zero are given by the formulas $$\alpha_m = \pi - \alpha_{N-m+1} \text{ and } (4/n \cdot \pi) \cdot \left(1 + \sum_{m=1}^{N/2} (-1)^m \cos n \cdot \alpha_m\right) = 0,$$

wherein m is a natural number and n is an odd number larger than or equal to 3.

4. A electronic device as claimed in claim 1, wherein the circuit part I comprises a rectifier and a low-pass filter.

5. A electronic device as claimed in claim 1, wherein the circuit part II and the circuit part III comprise a switching element, and a control circuit coupled to a control electrode of the switching element for rendering the switching element conducting and non-conducting when the phase angle $\alpha_m$ has a value at which the square-wave voltage Vb is zero.

6. A electronic device as claimed in claim 1, wherein the circuit part IV comprises a low-pass filter.

7. A electronic device as claimed in claim 1, wherein the electronic device comprises a microprocessor.

8. A electronic device as claimed in claim 1, wherein the electronic device is additionally provided with a circuit part VI for generating, from the sine-shaped voltage Vs, a current that can be used to energize a load.

9. A electronic device as claimed in claim 8, wherein the load is a lamp.

* * * * *